United States Patent
Zhu

(10) Patent No.: US 11,430,782 B2
(45) Date of Patent: Aug. 30, 2022

(54) SILICON CONTROLLED RECTIFIER AND METHOD FOR MAKING THE SAME

(71) Applicant: SHANGHAI HUALI MICROELECTRONICS CORPORATION, Shanghai (CN)

(72) Inventor: Tianzhi Zhu, Shanghai (CN)

(73) Assignee: SHANGHAI HUALI MICROELECTRONICS CORPORATION, Shanghai (CN)

( * ) Notice: Subject to any disclaimer, the term of this patent is extended or adjusted under 35 U.S.C. 154(b) by 0 days.

(21) Appl. No.: 17/234,633

(22) Filed: Apr. 19, 2021

(65) Prior Publication Data
US 2021/0335777 A1    Oct. 28, 2021

(30) Foreign Application Priority Data
Apr. 27, 2020    (CN) .......................... 202010343783.9

(51) Int. Cl.
*H01L 27/02* (2006.01)
*H01L 21/8228* (2006.01)

(52) U.S. Cl.
CPC ...... *H01L 27/0262* (2013.01); *H01L 21/8228* (2013.01)

(58) Field of Classification Search
None
See application file for complete search history.

(56) References Cited

U.S. PATENT DOCUMENTS

| | | | | |
|---|---|---|---|---|
| 5,576,557 | A * | 11/1996 | Ker | H01L 27/0259 257/361 |
| 6,465,848 | B2 * | 10/2002 | Ker | H01L 27/0251 257/361 |
| 7,566,914 | B2 * | 7/2009 | Salcedo | H01L 27/0262 257/335 |
| 8,193,560 | B2 * | 6/2012 | Gendron | H01L 21/00 257/357 |
| 9,123,540 | B2 * | 9/2015 | Salcedo | H01L 29/7436 |
| 9,171,832 | B2 * | 10/2015 | Salcedo | H01L 29/7436 |
| 9,362,266 | B1 * | 6/2016 | Lee | H01L 23/528 |
| 9,673,187 | B2 * | 6/2017 | Salcedo | H01L 27/0259 |
| 2010/0163973 | A1 * | 7/2010 | Nakamura | H01L 27/0635 438/237 |
| 2011/0207409 | A1 * | 8/2011 | Ker | H01L 27/0262 257/355 |
| 2014/0167106 | A1 * | 6/2014 | Salcedo | H01L 29/66378 257/146 |

* cited by examiner

*Primary Examiner* — Bilkis Jahan
(74) *Attorney, Agent, or Firm* — Alston & Bird LLP

(57) ABSTRACT

The present disclosure provides a silicon controlled rectifier and a manufacturing method thereof. The silicon controlled rectifier comprises: a P-type substrate; an N-type well 60, an upper portion of which is provided with a P-type heavily doped region 20 and an N-type heavily doped region 28; an N-type well 62, an upper portion of which is provided with a P-type heavily doped region 22 and an N-type heavily doped region 26; and a P-type well 70 connecting the N-type well 60 and the N-type well 62, an upper portion of which is provided with a P-type heavily doped region 24; wherein a first electrode is in mirror symmetry with a second electrode with respect to the P-type heavily doped region 24, and shallow trench isolations are respectively provided between the P-type heavily doped region 24 and each of the N-type heavily doped region 28 and the N-type heavily doped region 26.

12 Claims, 2 Drawing Sheets

SILICON CONTROLLED RECTIFIER AND METHOD FOR MAKING THE SAME

CROSS-REFERENCES TO RELATED APPLICATIONS

This application claims the priority to Chinese patent application No. CN202010343783.9, filed on Apr. 27, 2020, and entitled "SILICON CONTROLLED RECTIFIER AND METHOD FOR MAKING THE SAME", the disclosure of which is incorporated herein by reference in entirety.

TECHNICAL FIELD

The present disclosure relates to the field of semiconductor, in particular to a bidirectional no-snapback silicon controlled rectifier structure and a manufacturing method thereof.

BACKGROUND

In the field of electro-static discharge (ESD) protection design for high-voltage integrated circuits, a solution of applying no-snapback silicon controlled rectifiers (SCRs) connected in multi-stage series to the ESDESD protection circuit design at a high-voltage port has attracted much attention due to its advantage in significant saving in layout area.

Chinese patent CN108091650B disclosed a no-snapback silicon controlled rectifier structure as shown in FIG. 1. In FIG. 1, the silicon controlled rectifier includes a P-type substrate 180, the P-type substrate is provided with an N-type well 160 and a P-type well 170 therein, and the N-type well 160 and the P-type well 170 are adjacent to each other to form a PN junction at an interface between the N-type well 160 and the P-type well 170. A P-type heavily doped region 122 is formed near the upper portion of the interface between the N-type well 160 and the P-type well 170. A P-type heavily doped region 120 and an N-type heavily doped region 128 at the upper portion of the N-type well 160 form the anode A of the silicon controlled rectifier. A P-type heavily doped region 126 and an N-type heavily doped region 124 at the upper portion of the P-type well 170 form the cathode K of the silicon controlled rectifier.

The conventional silicon controlled rectifier has a relatively large current gain due to its dual positive feedbacks provided by those couplings between its internal parasitic PNP and NPN triodes, which leads to a strong snapback effect, that is, the holding voltage of the snapback effect is much lower than a trigger voltage. The silicon controlled rectifier shown in FIG. 1 is able to achieve a no-snapback effect, that is, the holding voltage of the snapback effect is close to or equal to the trigger voltage.

However this no-snapback silicon controlled rectifier is a unidirectional device, which is only applicable to the ESD protection circuit design of a positive high-voltage port, which means when the anode A is at a positive high voltage and the cathode K is grounded, a current path of the silicon controlled rectifier is P+120->N-type well 160->P-type well 170->N+124 (PNPN, as shown by the solid-line arrow in FIG. 1), which satisfies the requirements. However, when the anode A of the silicon controlled rectifier is at a negative high voltage and the cathode K is grounded, an internal parasitic diode formed by P+126 in P-type well 170->N+128 in N-type well 160 of the silicon controlled rectifier is in a forward conduction state, a current path of which is shown by the dashed-line arrow in FIG. 1, and such an conduction is not allowed during normal operation of the circuit. Therefore, the silicon controlled rectifier structure shown in FIG. 1 is inapplicable to the ESD protection circuit design of a negative high-voltage port.

In view of the above, there is an urgent need to develop a bidirectional silicon controlled rectifier that can achieve the no-snapback effect, so that the rectifier is applicable to the ESD protection circuit design of both positive and negative high-voltage I/O ports.

BRIEF SUMMARY

A brief overview of one or more aspects is given below to provide a basic understanding of these aspects. The overview is not an exhaustive overview of all of the aspects conceived, and is neither intended to identify key or decisive elements of all of the aspects nor is it attempts to define the scope of any or all of the aspects. The only purpose is to present some concepts of one or more aspects in a simplified form as a prelude to the more detailed description provided later.

In order to solve the problem that a silicon controlled rectifier in the prior art can not be applied to the electrostatic discharge protection circuit design of positive and negative high voltage I/O ports at the same time, an aspect of the present disclosure provides a silicon controlled rectifier, specifically comprising:

a P-type substrate (80);

an N-type well (60) located in the P-type substrate (80), wherein an upper portion of the N-type well (60) is provided with a P-type heavily doped region (20) and an N-type heavily doped region (28) which form a first electrode of the silicon controlled rectifier, and shallow trench isolation is provided between the P-type heavily doped region (20) and the N-type heavily doped region (28);

an N-type well (62) located in the P-type substrate (80), wherein an upper portion of the N-type well (62) is provided with a P-type heavily doped region (22) and an N-type heavily doped region (26) which form a second electrode of the silicon controlled rectifier, and shallow trench isolation is provided between the P-type heavily doped region (22) and the N-type heavily doped region (26); and a P-type well (70) located in the P-type substrate (80) and connecting the N-type well (60) and the N-type well (62), wherein an upper portion of the P-type well (70) is provided with a P-type heavily doped region (24); wherein the P-type heavily doped region (20) and the N-type heavily doped region (28) of the first electrode are in mirror symmetry with the P-type heavily doped region (22) and the N-type heavily doped region (26) of the second electrode with respect to the P-type heavily doped region (24), the N-type heavily doped region (28) and the N-type heavily doped region (26) are close to the P-type heavily doped region (24), and shallow trench isolation (90) is provided between the P-type heavily doped region (24) and each of the N-type heavily doped region (28) and the N-type heavily doped region (26).

In an embodiment of the silicon controlled rectifier, optionally, the P-type heavily doped region (20), the P-type heavily doped region (22), and the P-type heavily doped region (24) have the same ion doping concentration; and/or the N-type heavily doped region (28) and the N-type heavily doped region (26) have the same ion doping concentration.

In an embodiment of the silicon controlled rectifier, optionally, the width D1 of the shallow trench isolation (90) between the P-type heavily doped region (24) and each of the N-type heavily doped region (28) and the N-type heavily doped region (26) is associated with a trigger voltage of the silicon controlled rectifier.

In an embodiment of the silicon controlled rectifier, optionally, the width D1 is 0-2 micrometers.

In an embodiment of the silicon controlled rectifier, optionally, the width D2 of each of the N-type heavily doped region (28) and the N-type heavily doped region (26), the width D3 of the P-type heavily doped region (24), and the width S of the shallow trench isolation between the P-type heavily doped region (20) and the N-type heavily doped region (28) or between the P-type heavily doped region (22) and the N-type heavily doped region (26) are associated with a no-snapback state of the silicon controlled rectifier.

In an embodiment of the silicon controlled rectifier, optionally, the width D2 is 0.4-10 micrometers, the width D3 is 1-10 micrometers, and the width S is 0-2 micrometers.

Another aspect of the present disclosure provides a method for manufacturing a silicon controlled rectifier, specifically comprising steps of:

providing a P-type substrate (80);

forming, in the P-type substrate (80), an N-type well (60) corresponding to a first electrode of the silicon controlled rectifier, an N-type well (62) corresponding to a second electrode of the silicon controlled rectifier, and a P-type well (70) connecting the N-type well (60) and the N-type well (62);

forming a P-type heavily doped region (20) and an N-type heavily doped region (28) which form the first electrode at an upper portion of the N-type well (60), and forming shallow trench isolation between the P-type heavily doped region (20) and the N-type heavily doped region (28);

forming a P-type heavily doped region (22) and an N-type heavily doped region (26) which form the second electrode at an upper portion of the N-type well (62), and forming shallow trench isolation between the P-type heavily doped region (22) and the N-type heavily doped region (26); and forming a P-type heavily doped region (24) at an upper portion of the P-type well (70), and forming shallow trench isolation (90) between the P-type heavily doped region (24) and each of the N-type heavily doped region (28) and the N-type heavily doped region (26); wherein the P-type heavily doped region (20) and the N-type heavily doped region (28) are in mirror symmetry with the P-type heavily doped region (22) and the N-type heavily doped region (26) with respect to the P-type heavily doped region (24).

In an embodiment of the manufacturing method, optionally, the P-type heavily doped region (20), the P-type heavily doped region (22), and the P-type heavily doped region (24) having the same ion doping concentration are formed; and/or the N-type heavily doped region (28) and the N-type heavily doped region (26) having the same ion doping concentration are formed.

In an embodiment of the manufacturing method, optionally, the method further comprises adjusting the width D1 of the shallow trench isolation (90) between the P-type heavily doped region (24) and each of the N-type heavily doped region (28) and the N-type heavily doped region (26) according to a trigger voltage of the silicon controlled rectifier.

In an embodiment of the manufacturing method, optionally, the width D1 is under 2 micrometers.

In an embodiment of the manufacturing method, optionally, the method further comprises adjusting the width D2 of each of the N-type heavily doped region (28) and the N-type heavily doped region (26), the width D3 of the P-type heavily doped region (24), and the width S of the shallow trench isolation between the P-type heavily doped region (20) and the N-type heavily doped region (28) or between the P-type heavily doped region (22) and the N-type heavily doped region (26), so as to adjust a no-snapback state of the silicon controlled rectifier.

In an embodiment of the manufacturing method, optionally, the width D2 is 0.4-10 micrometers, the width D3 is 1-10 micrometers, and the width S is under 2 micrometers.

The silicon controlled rectifier provided in an aspect of the present disclosure is a bidirectional device which can achieve a non-snapback effect, and thus is applicable to the electro-static discharge protection circuit design of both positive and negative high-voltage I/O ports. The method for manufacturing a silicon controlled rectifier provided in another aspect of the present disclosure is compatible with an existing CMOS process, and can manufacture a bidirectional no-snapback silicon controlled rectifier which is applicable to the electro-static discharge protection of both positive and negative high-voltage ports, without increasing the manufacturing complexity.

BRIEF DESCRIPTION OF THE DRAWINGS

By reading the detailed description of the embodiments of the present disclosure with reference to the following drawings, the above-mentioned features and advantages of the present disclosure can be better understood. In the drawings, various components are not necessarily drawn to scale, and components with similar related characteristics or features may have the same or similar reference numerals.

REFERENCE NUMERALS

Figure 1:
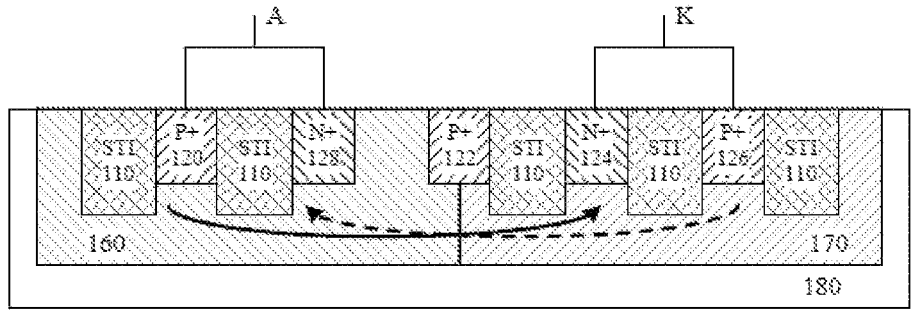
FIG. 1 illustrates a schematic structural diagram of a silicon controlled rectifier in the related art.

110 STI in related art
120, 122, 126 P-type heavily doped region in related art
124, 128 N-type heavily doped region in related art
160 N-type well
170 P-type well
180 P-type substrate
10 first and second shallow trench isolation
20, 22, 24 P-type heavily doped region
26, 28 N-type heavily doped region
60, 62 N-type well
70 P-type well
80 P-type substrate
90 Third and fourth shallow trench isolation

DETAILED DESCRIPTION OF THE DISCLOSURE

To provide a bidirectional no-snapback silicon controlled rectifier which is applicable to ESD protection of both positive and negative high-voltage ports, the present disclosure provides a silicon controlled rectifier structure and a manufacturing method thereof.

The following description enables readers to implement and use the present disclosure into specific application scenarios. Various modifications in different applications will be obvious to a person skilled in the art, and the general principles defined herein can be applied to embodiments in a relatively wide range. Therefore, the present disclosure is not limited to the embodiments given herein, but should be granted the broadest scope consistent with the principle and novel feature disclosed herein.

In the following detailed description, many specific details are set forth to provide a more thorough understanding of the present disclosure. However, it is obvious to a person skilled in the art that the practice of the present disclosure may not necessarily be limited to these specific details. In other words, certain structures and devices are shown in the form of block diagrams rater than in details, to avoid obscuring the present invention.

Readers should pay attention to all files and documents submitted along with this specification and open to the public for consulting this specification, and the contents of all of the files and documents are incorporated hereinto by reference. Unless otherwise directly stated, all the features disclosed in this specification (including any appended claims, abstract, and drawings) can be replaced by alternative features for achieving the same, equivalent, or similar purpose. Therefore, unless otherwise expressly stated, each feature disclosed is merely an example of a set of equivalent or similar features.

It should be noted that when used, the signs left, right, front, rear, top, bottom, front, back, clockwise, and counterclockwise are only used for the purpose of convenience, and do not imply any specific direction. In fact, they are used to reflect a relative position and/or orientation between various parts of an object.

As used herein, the terms "over", "under", "between", and "on" refer to a relative position of one layer relative to another layer. Likewise, for example, a layer deposited or placed over or under another layer may directly contact the other layer or may be separated from the other layer by one or more intermediate layers. Furthermore, a layer deposited or placed between layers may directly contact the layers or may be separated from the layers by one or more intermediate layers. In contrast, a first layer "on" a second layer is in contact with the second layer. In addition, a relative position of one layer relative to the other layers is provided (assuming that deposition, modification, and film removal operations are performed relative to a base substrate, regardless of the absolute orientation of the substrate).

As stated above, the present disclosure provides a bidirectional no-snapback silicon controlled rectifier which is applicable to the ESD protection of both positive and negative high-voltage ports and a manufacturing method thereof. Specifically, FIG. 2 illustrates a schematic flowchart of the manufacturing method for manufacturing the silicon controlled rectifier shown in FIG. 3 according to an embodiment of the present disclosure.

Figure 2:
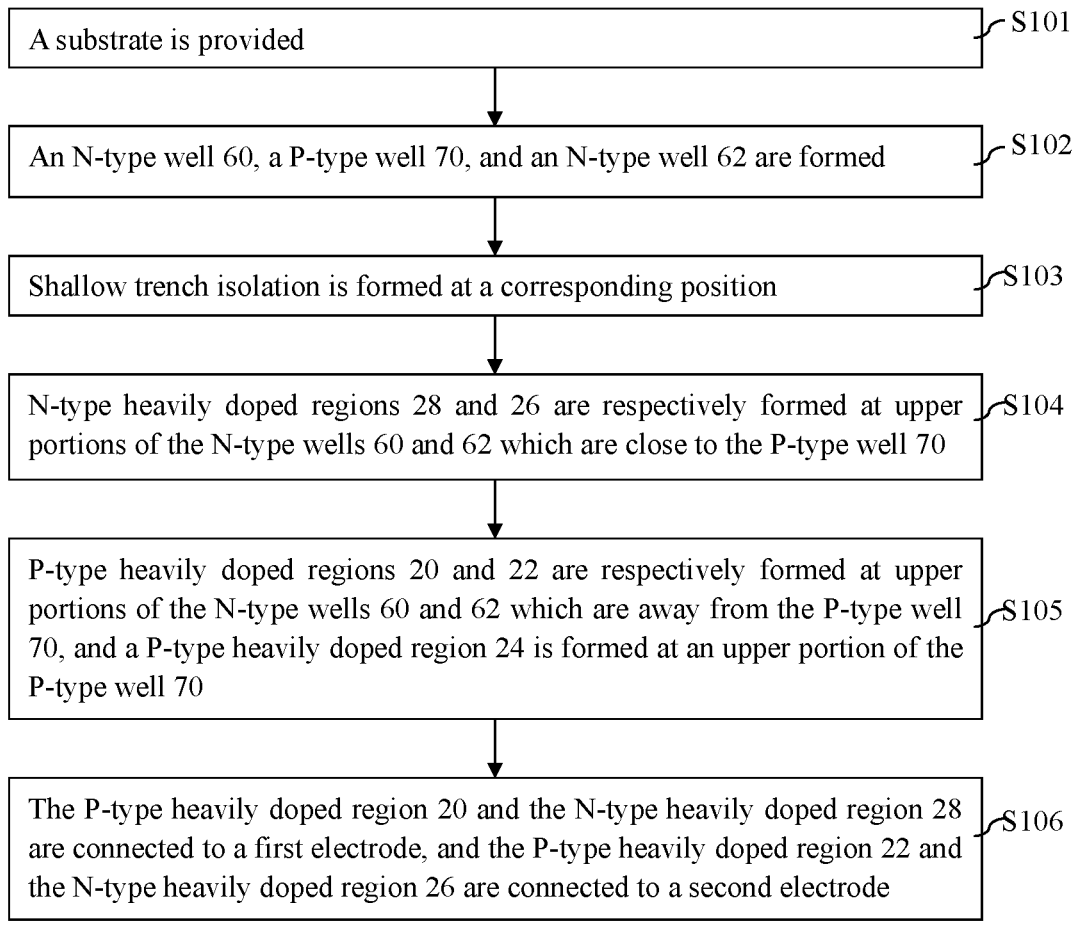
FIG. 2 illustrates a schematic flowchart of a method for manufacturing a silicon controlled rectifier according to an embodiment of the present disclosure.

Referring to FIG. 2, in step S101, a substrate is provided. The substrate can be a semiconductor wafer, such as a silicon wafer. Alternatively or additionally, the substrate may compose an elemental semiconductor material, a compound semiconductor material, and an alloy semiconductor material. Examples of the elemental semiconductor material may be but are not limited to one of crystalline silicon, polycrystalline silicon, amorphous silicon, germanium, and diamond. Examples of the compound semiconductor material may be but are not limited to one of silicon carbide (SiC), gallium arsenide (GaAs), gallium phosphide (GaP), indium phosphide (InP), indium arsenide (InAs), and indium antimonide (InSb). Examples of the alloy semiconductor material may be but are not limited to silicon germanium (SiGe), gallium arsenide phosphide (GaAsP), aluminum indium arsenide (AlInAs), aluminum gallium arsenide aluminum gallium arsenide (AlGaAs), gallium indium arsenide (GaInAs), gallium indium phosphide (GaInP), and gallium indium arsenide phosphide (GaInAsP). In an embodiment, the substrate is a P-type doped substrate.

Step S102: N-type doped wells 60 and 62 and a P-type doped well 70 are formed. The complete formation of each well includes at least three to five steps, including but not limited to epitaxial growth, original oxidation growth, ion implantation using a mask, high-energy secondary ion implantation, and an annealing operation.

In step S102, P-type well 70 is formed between the two N-type wells 60 and 62. Because the P-type well 70 is adjacent to both the N-type well 60 and N-type well 62, so a PN junctions is formed at the interface between the P-type well 70 and the N-type well 60 and another is formed at the interface between the P-type well 70 and the N-type well 62.

Step S103: shallow trench isolation (STI) 10 is formed at a corresponding position. The STI 10 forming process includes but is not limited to shallow trench etching, oxide filling, and oxide planarization. The shallow trench etching includes but is not limited to oxide layer isolation, nitride precipitation, STI using a mask, and STI shallow trench etching. The STI oxide filling includes but is not limited to trench liner silicon oxide deposition, trench chemical vapor deposition (CVD) oxide filling, or physical vapor deposition (PVD) oxide filling. The planarization of the silicon wafer surface can be implemented by means of a variety of methods. The planarization of the silicon wafer can be implemented by filling a gap with spin-on-glass (SOG), wherein the SOG can consist of 80% of solvent and 20% of silicon dioxide, the SOG layer is baked after deposition to evaporate out the solvent, and the silicon dioxide will be left in the gap, followed by performing etching-back of the entire surface to reduce the thickness of the full silicon wafer. The planarization process can also be effectively implemented by means of a chemical mechanical planarization (CMP) process (also referred to as a polishing process), including but not limited to polishing and removal of the trench oxide and nitride. The electrical isolation between devices on the substrate can be effectively implemented by means of the STI.

Step S104: an N-type heavily doped region 28 and an N-type heavily doped region 26 are respectively formed at upper portions of the N-type well 60 and the N-type well 62 which are next to the P-type well 70. In this embodiment, N-type doping may include dopants such as arsenic (As), phosphorus (P), and other group V elements, or some combinations thereof. It can be understood that the N-type heavily doped region 28 and the N-type heavily doped region 26 have the same ion doping concentration according to some examples. The N-type heavily doped region 28 is in mirror symmetry with the N-type heavily doped region 26 with respect to the P-type well 70, spaced from the P-type well 70 by a specific distance, that is, active regions of the N-type well 60 and the N-type well 62 are respectively disposed between the P-type well 70 and one of the N-type heavily doped region 28 and the N-type heavily doped region 26.

Step S105: a P-type heavily doped region 20 and a P-type heavily doped region 22 are respectively formed at upper portions of the N-type well 60 and the N-type well 62 at each side of the P-type well 70, and a P-type heavily doped region 24 is formed at an upper portion of the P-type well 70. In an example, P-type doping may be composed of dopants such as boron (B) or other group III elements. In an example, it can be understood that the P-type heavily doped region 20, the P-type heavily doped region 22, and the P-type heavily doped region 24 may compose the same ion doping concentration. With reference to the N-type heavily doped region 28 and the N-type heavily doped region 26 formed in step S104, the active regions are provided respectively between the P-type heavily doped region 24 at the upper portion of the P-type well 70 and each of the N-type heavily doped region 28 and the N-type heavily doped region 26. Similarly, the P-type heavily doped region 20 is in minor symmetry with the P-type heavily doped region 22 with respect to the P-type well 70. With reference to step S103, one STI is provided between the P-type heavily doped region 20 and the N-type heavily doped region 28, and another STI is provided between the P-type heavily doped region 22 and the N-type heavily doped region 26.

Step S106: the P-type heavily doped region 20 and the N-type heavily doped region 28 are connected to an anode, and the P-type heavily doped region 22 and the N-type heavily doped region 26 are connected to a cathode. The structure of the silicon controlled rectifier formed according to an aspect of the present disclosure includes the N-type well 60 and the N-type well 62 in minor symmetry with respect to the P-type well 70, and the heavily doped regions formed in the N-type well 60 and the N-type well 62 are also in mirror symmetry with respect to the P-type well 70. Therefore, readers can adjust the positions of the cathode and anode of the silicon controlled rectifier according to specific needs of the layout design. For example, in another embodiment, the P-type heavily doped region 20 and the N-type heavily doped region 28 form the cathode of the silicon controlled rectifier, and the P-type heavily doped region 22 and the N-type heavily doped region 26 form the anode of the silicon controlled rectifier.

It should be noted that, although the procedure of the manufacturing method is described is following a specific flow, in which the STI is formed first, then the N-type doped region is formed, and finally the P-type doped region is formed, in a real application a reader can make the STI, the N-type doped region, and the P-type doped region according to another future process. The order of manufacturing the STI, the N-type doped region, and the P-type doped region taken by a reader of the disclosure shall not limit the protection scope of the present disclosure inappropriately.

Accordingly, the bidirectional no-snapback silicon controlled rectifier formed by the disclosed manufacturing method is applicable to the ESD protection of both positive and negative high-voltage ports. In addition, the manufacturing process is compatible with the existing CMOS process, without increasing the manufacturing complexity therefore saving cost.

More specifically, according to an embodiment of the manufacturing method, the silicon controlled rectifier define its trigger voltage by proper designing of the widths D1 of the STIs 90 between the P-type heavily doped region 24 and the N-type heavily doped region 28 and the N-type heavily doped region 26 respectively. In an embodiment, the width D1 can be made in a range under 2 um to control the trigger voltage to satisfy various needs. In the above embodiment provided by the present disclosure, the STIs 90 are provided between the P-type heavily doped region 24 and each of the N-type heavily doped region 28 and the N-type heavily doped region 26 respectively, the shallow trench isolations 90 can prevent lateral diffusion between N+28 and P+24 and between N+26 and P+24, resulting in a reduction in the actual width of the active regions. Because the lateral diffusion is suppressed by the STIs 90, a leakage current is thereby effectively reduced.

There are two parasitic diodes in the device: the parasitic diode between N+ 28 (in N-type well 60) and P+ 24 and the parasitic diode between N+ 26 (in N-type well 62) and P+24. If the widths D1 of the STIs 90 between the P-type heavily doped region 24 and each of the N-type heavily doped region 28 and the N-type heavily doped region 26 are increased, the distance between the N-type heavily doped region 28 and the P-type heavily doped region 24 and the distance between the N-type heavily doped region 26 and the P-type heavily doped region 24 are increased, a reverse breakdown voltage of the parasitic diode N+28 (in N-type well 60) to +24 and the parasitic diode N+26 (in N-type well 62) to P+24 inside the silicon controlled rectifier is increased within a specific range. Therefore, the trigger voltage of a snapback effect of the silicon controlled rectifier is increased.

In another embodiment, a no-snapback state of the silicon controlled rectifier can be defined by setting the widths D2 of the N-type heavily doped region 28 and the N-type heavily doped region 26 respectively, or the width D3 of the P-type heavily doped region 24, or the widths S of the STI between the P-type heavily doped region 20 and the N-type heavily doped region 28 or between the P-type heavily doped region 22 and the N-type heavily doped region 26 respectively. In an example, D2 can be set in a range of 0.4-10 um, the width D3 can be set in a range of 1-10 um, and the width S can be set in a range under 2 um, so as to control the silicon controlled rectifier with functions in the no-snapback state.

Specifically, if D2 and D3 are built in their higher ends of the ranges, for instance near 10 um, the silicon controlled rectifier is more likely to enter the no-snapback state than if D2 and D3 are set at their low ends. Readers could determine appropriate D2 and D3 according to the threshold voltages required for entering the no-snapback state. In addition, the distribution of carrier holes injected from P+20 and P+22 into the N-type wells 60 and 62 can be improved by adjusting the width S of the STI between the P-type heavily doped region 20 and the N-type heavily doped region 28 or between the P-type heavily doped region 22 and the N-type heavily doped region 26, to improve the efficiency of the N-type heavily doped region 28 and the N-type heavily doped region 26 used as guard rings, i.e., improving the efficiency of recombination annihilation of the carrier holes performed by the electrons from the N-type heavily doped region 28 and the N-type heavily doped region 26.

Figure 3:
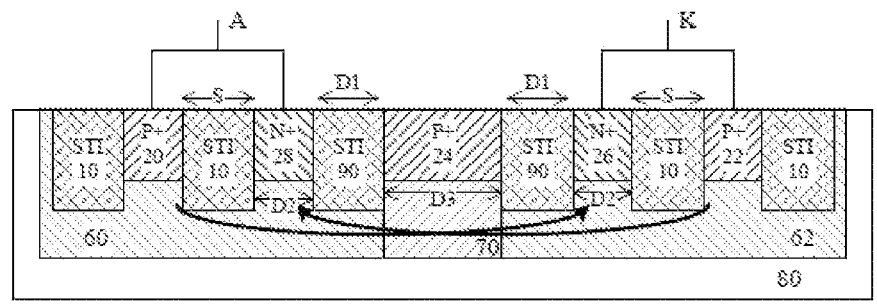
FIG. 3 illustrates a schematic structural diagram of a silicon controlled rectifier according to an embodiment of the present disclosure.

FIG. 3 illustrates the schematic structural diagram of the silicon controlled rectifier. In FIG. 3, the silicon controlled rectifier includes a P-type substrate 80. An N-type well 60 is formed at an upper portion of the P-type substrate 80, the P-type heavily doped region 20 and the N-type heavily doped region 28 form a first electrode (the anode A in FIG. 3) of the silicon controlled rectifier at the upper portion of the N-type well 60, and the STI 10 is provided between the P-type heavily doped region 20 and the N-type heavily doped region 28. An N-type well 62 is formed at the upper portion of the P-type substrate 80, the P-type heavily doped region 22 and the N-type heavily doped region 26 form a second electrode (the cathode K in FIG. 3) of the silicon controlled rectifier at the upper portion of the N-type well 62, and a STI 10 is formed between the P-type heavily doped region 22 and the N-type heavily doped region 26.

The cathode and anode of the silicon controlled rectifier are both built above an N-type well, a P-type well 70 connected to the N-type well 60 and the N-type well 62 is further disposed at the upper portion of the P-type substrate 80 of the silicon controlled rectifier to ensure that the device operates normally. The P-type well 70 is adjacent to each of the N-type well 60 and the N-type well 62, so that the PN junctions are formed at the interfaces between the P-type well 70 and the N-type well 60 and the N-type well 62 respectively. A P-type heavily doped region 24 is further disposed at the upper portion of the P-type well 70.

To ensure the normal operation of the silicon controlled rectifier, the N-type heavily doped region 28 and the N-type heavily doped region 26 are close to the P-type heavily doped region 24, and the P-type heavily doped region 20 and the P-type heavily doped region 22 are disposed on the farther side of the STI 10 from P-type heavily doped region 24. Therefore, when the anode A in FIG. 3 is connected to a positive high voltage, a current flows from P+20 through the N-type well 60 (N+28) and the P-type well 70 (under P+24) to the N-type well 62 (N+26) (through junctions PNPN, as shown by the solid line arrow at left in FIG. 3), satisfying the requirements of the silicon controlled rectifier.

In addition, in the silicon controlled rectifier provided in an aspect of the present disclosure as shown in FIG. 3, since the cathode and anode of the silicon controlled rectifier are in mirror symmetry with respect to the P-type well 70. When the anode A in FIG. 3 is connected to a negative high voltage, a current flows from P+22 through the N-type well 62 (N+26) and the P-type well 70 (P+24) to the N-type well 60 (N+28) (through junctions PNPN, as shown by the solid arrow at right in FIG. 3), likewise satisfying the requirements of the silicon controlled rectifier. That is, by configuring two N-type wells in mirror symmetry with respect to the P-type well 70 and forming the N and P-type heavily doped regions symmetrically for the cathode and anode of the silicon controlled rectifier on the upper portions of the two N-type wells, the silicon controlled rectifier is applicable to the electro-static discharge protection of both positive and negative high-voltage ports.

As a symmetrical structure, the P-type heavily doped region 20, the P-type heavily doped region 22, and the P-type heavily doped region 24 have the same ion doping concentration. In another example, the N-type heavily doped region 28 and the N-type heavily doped region 26 have the same ion doping concentration.

In FIG. 3 that in the silicon controlled rectifier provided in an aspect of the present disclosure, the STIs 90 are respectively provided between the P-type heavily doped region 24 and each of the N-type heavily doped region 28 and the N-type heavily doped region 26. In the above embodiment of the present disclosure, the STIs 90 are provided between the P-type heavily doped region 24 and each of the N-type heavily doped region 28 and the N-type heavily doped region 26, the STIs 90 can prevent lateral diffusion between N+28 and P+24, and between N+26 and P+24, resulting in a reduction in the actual widths of the active regions. The STIs 90 suppress the lateral diffusion, thereby a leakage current is effectively reduced.

Furthermore, in the above embodiment, the widths D1 of the STIs 90 between the P-type heavily doped region 24 and each of the N-type heavily doped region 28 and the N-type heavily doped region respectively are associated with the trigger voltage of the silicon controlled rectifier. In an embodiment, the widths D1 can be set to a range under 2 um to control the trigger voltage to meet requirements for the silicon controlled rectifier.

If the widths D1 of the STIs 90 between the P-type heavily doped region 24 and each of the N-type heavily doped region 28 and the N-type heavily doped region 26 are increased, that is, the distance between the N-type heavily doped region 28 and the P-type heavily doped region 24 and the distance between the N-type heavily doped region 26 and the P-type heavily doped region 24 are increased, a reverse breakdown voltage of the parasitic diode between N+28 (N-type well 60) and P+24 and the parasitic diode between N+26 (N-type well 62) and P+24 inside the silicon controlled rectifier is increased within a specific range. Therefore, the trigger voltage of a snapback effect of the silicon controlled rectifier will be increased.

Furthermore, the width D2 of each of the N-type heavily doped region 28 and the N-type heavily doped region 26, the width D3 of the P-type heavily doped region 24, and the width S of the STI 10 between the P-type heavily doped region 20 and the N-type heavily doped region 28 or between the P-type heavily doped region 22 and the N-type heavily doped region 26 are associated with the no-snapback state of the silicon controlled rectifier. In an embodiment, D2 can be set to be in a range of 0.4-10 um, the width D3 can be set to be in a range of 1-10 um, and the width S can be set to a range under 2 um, so as to adjust whether the silicon controlled rectifier enters the no-snapback state.

If D2 and D3 are built in their higher ends of the ranges, for instance near 10 um, the silicon controlled rectifier is more likely to enter the no-snapback state than if D2 and D3 are set at their low ends. Readers could determine appropriate D2 and D3 according to the threshold voltages required for entering the no-snapback state. In addition, the distribution of the carrier holes injected from P+20 and P+22 into the N-type wells 60 and 62 can be improved by setting the width S of the STI between the P-type heavily doped region 20 and the N-type heavily doped region 28 or between the P-type heavily doped region 22 and the N-type heavily doped region 26, to improve the efficiency of the use of the N-type heavily doped region 28 and the N-type heavily doped region 26 as guard rings, i.e., improving the efficiency of recombination annihilation of the carrier holes performed by the N-type heavily doped region 28 and the N-type heavily doped region 26.

According to the above description, since the silicon controlled rectifier provided in an aspect of the present disclosure has a symmetrical structure, the silicon controlled rectifier is applicable to the ESD protection of both positive and negative high-voltage ports, satisfying different conditions for the electro-static discharge protection, and thereby having a relatively wide application range.

Figure 4:
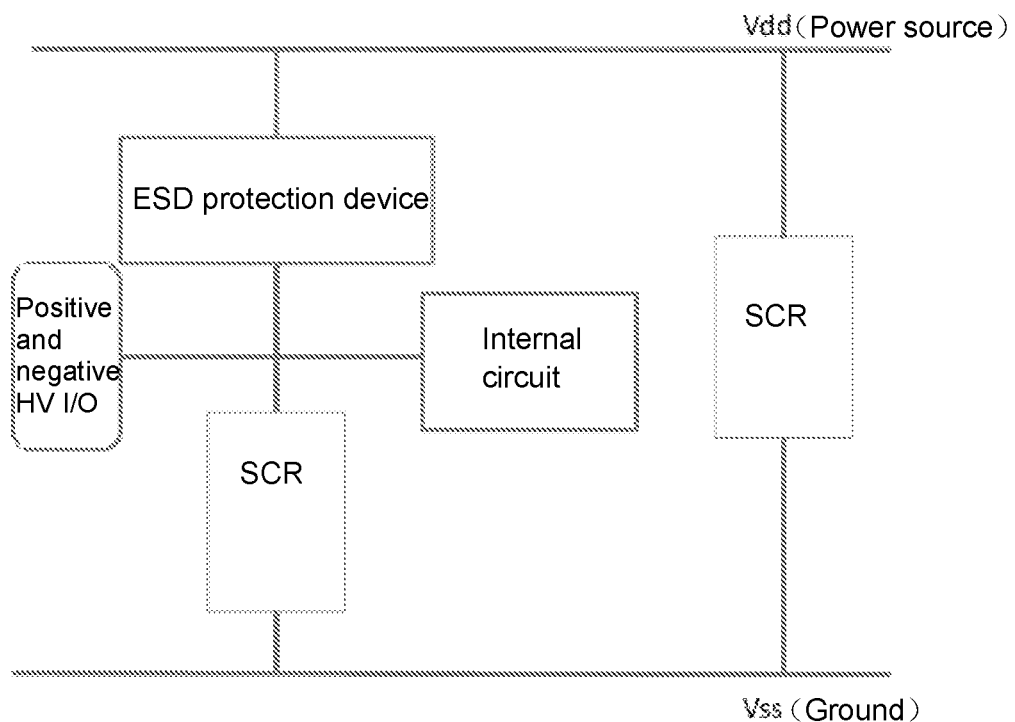
FIG. 4 illustrates a schematic diagram of an exemplary silicon controlled rectifier circuit according to an embodiment of the present disclosure.

FIG. 4 illustrates a schematic diagram of an application scenario of the silicon controlled rectifier provided by the present disclosure. Referring to FIG. 4, the silicon controlled rectifier provided by the present disclosure is applied to an ESD protection circuit to effectively protect the circuit.

The embodiments of a silicon controlled rectifier and a manufacturing method thereof are described above. Although the present disclosure is described with respect to specific exemplary embodiments, it is obvious that various modifications and changes can be made to these embodiments without departing from the broader spirit and scope of the present disclosure. Therefore, the specification and drawings should be construed as being illustrative rather than restrictive.

It should be understood that this specification will not be used to interpret or limit the scope or meaning of the claims. In addition, in the foregoing detailed description, it can be seen that various features are combined together in a single embodiment for the purpose of simplifying the present disclosure. The method of the present disclosure should not be construed as reflecting that the claimed embodiments require more features than those explicitly listed in each claim. On the contrary, as reflected in the appended claims, the inventive subject matter includes features less than all the features of a single disclosed embodiment. Therefore, the appended claims are hereby incorporated into the detailed description, with each claim independently used as an independent embodiment.

An embodiment or embodiments mentioned in the description are intended to be included in at least one embodiment of a circuit or method in combination with the specific features, structures, or characteristics described in the embodiment. The phrase "one embodiment" in various portions of the specification does not necessarily refer to the same embodiment.

What is claimed is:

1. A silicon controlled rectifier, comprising:
   a P-type substrate (80);
   a first N-type well (60) disposed in the P-type substrate (80), wherein the first N-type well (60) comprises a first P-type heavily doped region (20) and a first N-type heavily doped region (28) in an upper portion of the first N-type well (60), wherein the first P-type heavily doped region (20) and the first N-type heavily doped region (28) form a first electrode of the silicon controlled rectifier; and a first shallow trench isolation disposed between the first P-type heavily doped region (20) and the first N-type heavily doped region (28);
   a second N-type well (62) located in the P-type substrate (80), wherein the second N-type well (62) comprises a second P-type heavily doped region (22) and a second N-type heavily doped region (26) in an upper portion of the second N-type well, wherein the second P-type heavily doped region (22) and the second N-type heavily doped region (26) form a second electrode of the silicon controlled rectifier; and a second shallow trench isolation disposed between the second P-type heavily doped region (22) and the second N-type heavily doped region (26); and
   a P-type well (70) disposed between the first N-type well (60) and the second N-type well (62) in the P-type substrate (80), wherein an upper portion of the P-type well (70) comprises a third P-type heavily doped region (24); wherein the first P-type heavily doped region (20) and the first N-type heavily doped region (28) of the first electrode are in mirror symmetry with the second P-type heavily doped region (22) and the second N-type heavily doped region (26) of the second electrode with respect to the third P-type heavily doped region (24), the first N-type heavily doped region (28) and the second N-type heavily doped region (26) are close to the third P-type heavily doped region (24); and
   wherein a third shallow trench isolation is disposed between the third P-type heavily doped region (24) and the first N-type heavily doped region (28), and a fourth shallow trench isolation is disposed between the third P-type heavily doped region (24) and the second N-type heavily doped region (26).

2. The silicon controlled rectifier according to claim 1, wherein the first P-type heavily doped region (20), the second P-type heavily doped region (22), and the third P-type heavily doped region (24) have a same ion doping concentration; and/or
   wherein the first N-type heavily doped region (28) and the second N-type heavily doped region (26) have a same ion doping concentration.

3. The silicon controlled rectifier according to claim 1, wherein the third shallow trench isolation and the fourth shallow trench isolation have a same width D1, and wherein the width D1 is associated with a trigger voltage of the silicon controlled rectifier.

4. The silicon controlled rectifier according to claim 3, wherein the width D1 is in a range under 2 micrometers.

5. The silicon-controlled rectifier according to claim 1, wherein the first N-type heavily doped region (28) and the second N-type heavily doped region (26) have a same width D2; wherein the third P-type heavily doped region (24) has a width D3; wherein the first shallow trench isolation and the second shallow trench isolation have a same width S; and wherein D2, D3 and S are associated with a no-snapback state of the silicon controlled rectifier.

6. The silicon controlled rectifier according to claim 5, wherein the width D2 is in a range of 0.4-10 micrometers, the width D3 is in a range of 1-10 micrometers, and the width S is in a range under 2 micrometers.

7. A method for manufacturing a silicon controlled rectifier, comprising steps of:
   providing a P-type substrate (80);
   forming, in the P-type substrate (80), a first N-type well (60) at a side of a first electrode of the silicon controlled rectifier, a second N-type well (62) at a side of a second electrode of the silicon controlled rectifier, and a P-type well (70) disposed connecting to the first N-type well (60) and the second N-type well (62);
   forming a first P-type heavily doped region (20) and a first N-type heavily doped region (28) wherein the first P-type heavily doped region (20) and the first N-type heavily doped region (28) form the first electrode at an upper portion of the first N-type well (60), and forming a first shallow trench isolation between the first P-type heavily doped region (20) and the first N-type heavily doped region (28);
   forming a second P-type heavily doped region (22) and a second N-type heavily doped region (26), wherein the second P-type heavily doped region (22) and the second N-type heavily doped region (26) form the second electrode at an upper portion of the second N-type well (62), and forming a second shallow trench isolation between the second P-type heavily doped region (22) and the second N-type heavily doped region (26);
   forming a third P-type heavily doped region (24) at an upper portion of the P-type well (70);
   forming a third shallow trench isolation between the third P-type heavily doped region (24) and the first N-type heavily doped region (28); and
   forming a fourth shallow trench isolation between the third P-type heavily doped region (24) and the second N-type heavily doped region (26);
   wherein the first P-type heavily doped region (20) and the first N-type heavily doped region (28) are in mirror symmetry with the second P-type heavily doped region (22) and the second N-type heavily doped region (26) with respect to the P-type heavily doped region (24).

8. The manufacturing method according to claim 7, wherein the first P-type heavily doped region (20), the second P-type heavily doped region (22), and the third P-type heavily doped region (24) have a same ion doping concentration; and/or wherein the first N-type heavily doped region (28) and the second N-type heavily doped region (26) have a same ion doping concentration.

9. The manufacturing method according to claim 7, further comprising setting a same width D1 for the first active region and the second active region, wherein the width D1 is determined based on a trigger voltage of the silicon controlled rectifier.

10. The manufacturing method according to claim 9, wherein the width D1 is in a range under 2 micrometers.

11. The manufacturing method according to claim 7, further comprising:
  setting a same width D2 for each of the first N-type heavily doped region (28) and the second N-type heavily doped region (26);
  setting a width D3 for the third P-type heavily doped region (24); and
  setting a same width S for the first shallow trench isolation and the second shallow trench isolation;
  wherein setting the width D2, the width D3 and the width S is for adjusting a no-snapback state of the silicon controlled rectifier.

12. The manufacturing method according to claim 11, wherein the width D2 is in a range of 0.4-10 micrometers, the width D3 is in a range of 1-10 micrometers, and the width S is in a range under 2 micrometers.

\* \* \* \* \*